United States Patent
Seo

(10) Patent No.: US 11,324,123 B2
(45) Date of Patent: May 3, 2022

(54) PRINTED CIRCUIT NANOFIBER WEB MANUFACTURING METHOD

(71) Applicant: AMOGREENTECH CO., LTD, Gyeonggi-do (KR)

(72) Inventor: In Yong Seo, Seoul (KR)

(73) Assignee: AMOGREENTECH CO., LTD, Gyeonggi-do (KR)

(*) Notice: Subject to any disclaimer, the term of this patent is extended or adjusted under 35 U.S.C. 154(b) by 45 days.

(21) Appl. No.: 16/606,192

(22) PCT Filed: Apr. 20, 2018

(86) PCT No.: PCT/KR2018/004600
§ 371 (c)(1),
(2) Date: Oct. 17, 2019

(87) PCT Pub. No.: WO2018/194414
PCT Pub. Date: Oct. 25, 2018

(65) Prior Publication Data
US 2020/0137891 A1    Apr. 30, 2020

(30) Foreign Application Priority Data

Apr. 21, 2017   (KR) .................. 10-2017-0051596
Apr. 21, 2017   (KR) .................. 10-2017-0051601

(51) Int. Cl.
*H05K 3/18*    (2006.01)
*H05K 1/03*    (2006.01)
(Continued)

(52) U.S. Cl.
CPC .......... *H05K 3/181* (2013.01); *H05K 1/0393* (2013.01); *H05K 1/09* (2013.01); *H05K 1/18* (2013.01);
(Continued)

(58) Field of Classification Search
USPC ........................ 427/58, 98.4, 99.5
See application file for complete search history.

(56) References Cited

U.S. PATENT DOCUMENTS 6,492,183 B1   12/2002   Perman et al.
7,504,550 B2   3/2009    Tippey et al.
(Continued)

FOREIGN PATENT DOCUMENTS

JP   2015-088537   5/2015
KR   10-0862149    10/2008
(Continued)

*Primary Examiner* — Brian K Talbot
(74) *Attorney, Agent, or Firm* — Morrison & Foerster, LLP

(57) ABSTRACT

Provided is a method of manufacturing a printed circuit nano-fiber web. A method of manufacturing a printed circuit nano-fiber web according to an embodiment of the present invention includes (1) a step of electrospinning a spinning solution including a fiber-forming ingredient to manufacture a nano-fiber web; and (2) a step of forming a circuit pattern to coat an outer surface of nano-fiber included in a predetermined region on the nano-fiber web using an electroless plating method. According to the present invention, a circuit pattern-printed nano-fiber web having flexibility and resilience suitable for future smart devices may be realized. In addition, a circuit pattern may be densely formed to a uniform thickness on a flexible nano-fiber web using an electroless plating method, and the flexible nano-fiber web may include a plurality of pores. Accordingly, since the printed circuit nano-fiber web may satisfy waterproofness and air permeability characteristics, it can be used in various future industrial fields including medical devices, such as biopatches, and an electronic device, such as smart devices.

8 Claims, 8 Drawing Sheets

(51) Int. Cl.
*H05K 1/09* (2006.01)
*H05K 1/18* (2006.01)
*H05K 3/10* (2006.01)
*H05K 3/12* (2006.01)
*C23C 18/18* (2006.01)
*C23C 18/16* (2006.01)
*H05K 3/38* (2006.01)
*B05D 5/12* (2006.01)
*C23C 18/04* (2006.01)
*B05D 1/32* (2006.01)
*C23C 18/28* (2006.01)
*C23C 18/06* (2006.01)

(52) U.S. Cl.
CPC ............... *H05K 3/108* (2013.01); *H05K 3/12* (2013.01); *B05D 1/32* (2013.01); *B05D 5/12* (2013.01); *B05D 2201/02* (2013.01); *C23C 18/04* (2013.01); *C23C 18/06* (2013.01); *C23C 18/16* (2013.01); *C23C 18/1605* (2013.01); *C23C 18/1608* (2013.01); *C23C 18/1644* (2013.01); *C23C 18/18* (2013.01); *C23C 18/1831* (2013.01); *C23C 18/1834* (2013.01); *C23C 18/28* (2013.01); *H05K 3/184* (2013.01); *H05K 3/38* (2013.01)

(56) References Cited

U.S. PATENT DOCUMENTS

| | | | | |
|---|---|---|---|---|
| 7,951,425 | B2* | 5/2011 | Demir | B82Y 30/00 427/322 |
| 2010/0096317 | A1 | 4/2010 | Morita et al. | |
| 2010/0129628 | A1* | 5/2010 | Young | D04H 3/03 428/219 |
| 2010/0206614 | A1* | 8/2010 | Park | H01H 13/88 174/126.1 |
| 2014/0287230 | A1* | 9/2014 | Walls | C23C 16/4417 428/338 |
| 2014/0335459 | A1* | 11/2014 | Im | B82Y 40/00 430/324 |
| 2015/0072070 | A1* | 3/2015 | Saijo | C23C 18/1653 427/98.6 |
| 2015/0104565 | A1* | 4/2015 | Chen | C23C 18/44 427/108 |
| 2015/0257263 | A1* | 9/2015 | Sethumadhavan | H05K 1/0366 257/88 |
| 2016/0111730 | A1* | 4/2016 | Kim | H01M 8/186 429/405 |
| 2016/0136584 | A1* | 5/2016 | Hwang | B01D 39/1623 210/483 |
| 2016/0159667 | A1* | 6/2016 | Hwang | C02F 1/4691 204/665 |
| 2016/0229719 | A1* | 8/2016 | Seo | B01D 63/10 |
| 2017/0005504 | A1* | 1/2017 | Rho | G04G 17/04 |
| 2020/0283618 | A1 | 5/2020 | Choi et al. | |
| 2021/0086136 | A1 | 3/2021 | Jeong et al. | |

FOREIGN PATENT DOCUMENTS

| | | |
|---|---|---|
| KR | 10-2009-0058513 | 6/2009 |
| KR | 10-2010-0023646 | 3/2010 |
| KR | 10-2010-0070041 | 6/2010 |
| KR | 10-1139970 | 4/2011 |
| KR | 10-2014-0015890 | 2/2014 |
| KR | 10-2014-0128528 | 11/2014 |
| KR | 10-2017-0023394 | 3/2017 |
| WO | WO 2015/053443 | 4/2015 |
| WO | WO 2015/108247 | 7/2015 |

* cited by examiner

X-X'

PRINTED CIRCUIT NANOFIBER WEB MANUFACTURING METHOD

CROSS REFERENCE TO RELATED APPLICATIONS

This application is a national stage application under 35 U.S.C. § 371 of International Application No. PCT/KR2018/004600, filed internationally on Apr. 20, 2018, which claims priority to Korean Patent Application No. 10-2017-0051596, filed Apr. 21, 2017 and Korean Patent Application No. 10-2017-0051601, filed Apr. 21, 2017, the disclosures of which are incorporated herein by reference in their entirety.

TECHNICAL FIELD

The present invention relates to a printed circuit nano-fiber web, and more particularly, to a method of manufacturing a printed circuit nano-fiber web having flexibility, resilience, waterproofness, and air permeability, a printed circuit nano-web manufactured by the method, and an electronic device including the printed circuit nano-fiber web.

BACKGROUND ART

In general, the utilization of a printed circuit board (PCB), which is a basic component of various electric and electronic products, is gradually increasing in semiconductor modules, inspection devices, automobiles, defense industries, and satellites as well as household appliances.

Meanwhile, future smart devices to be developed and utilized in the future are expected to be structurally and conceptually different from existing devices. In particular, smart devices have recently been developed in forms wherein electronic parts are embedded in glasses, clothing, and the like to be wearable on the human body and to facilitate daily life. According to such a development trend, the development of a printed circuit board that is wearable by a user can promote the development of future devices such as smart clothing. Therefore, research and technology development of a printed circuit board that has improved flexibility and, accordingly, is wearable on the human body is necessary.

General printed circuit boards can be classified into a rigid Printed Circuit Board (PCB) manufactured by adding a reinforcement material, such as glass fiber, to an epoxy resin and adhering copper foil thereto; a Flexible Printed Circuit Board (FPCB) manufactured by adhering copper foil onto a polyimide substrate; and a Rigid-Flexible Printed Circuit Board (R-F PCB) manufactured by combining advantages of the FPCB and the rigid PCB. Korean Patent No. 10-1139970 (Patent Document 1) discloses a method of manufacturing an FPCB, the method including five steps such as a first step of forming a circuit pattern on a seed layer formed on a flexible insulating substrate; a second step of applying a first photosensitive material onto the circuit pattern; a third step of exposing and developing the first photosensitive material to form a protective pattern on the circuit pattern; a fourth step of etching the seed layer; and a fifth step of peeling off the protective pattern, wherein the first photosensitive material is a liquid- or film-type photosensitizer.

The method of Patent Document 1 allows realization of a flexible printed circuit board. However, since a base member of the flexible printed circuit board is a flexible insulating substrate such as a polyimide film, the flexible printed circuit board does not have sufficient flexibility. In addition, resilience of being refolded after being folded or crumpled cannot be anticipated, and air permeability is not provided. Accordingly, the flexible printed circuit board cannot be applied to smart devices, etc. requiring wearability.

Therefore, there is an urgent need for development of a printed circuit board that is wearable while having flexibility, resilience, and air permeability, thus being applicable to flexible electronic devices or future wearable smart devices.

DISCLOSURE

Technical Problem

Therefore, the present invention has been made in view of the above problems, and it is one object of the present invention to provide a method of manufacturing a printed circuit board having flexibility and resilience by printing a circuit pattern on a nano-fiber web and an electronic device including the printed circuit board.

It is another object of the present invention to provide a method of manufacturing a printed circuit board using an electroless plating method capable of increasing compactness and thickness uniformity of a circuit pattern and plating a circuit pattern on a flexible substrate such as a nano-fiber web, and an electronic device including the printed circuit board.

It is yet another object of the present invention to provide a method of manufacturing a printed circuit board that includes a nano-fiber web including a plurality of pores formed by accumulating nano-sized fibers, as a base substrate, and thus, satisfies flexibility, resilience, and air permeability required for a bio-patch or a medical sensor, and an electronic device including the printed circuit board.

Technical Solution

In accordance with an aspect of the present invention, the above and other objects can be accomplished by the provision of a method of manufacturing a printed circuit nano-fiber web (1), the method including (1) a step of electro-spinning a spinning solution including a fiber-forming ingredient to manufacture a nano-fiber web; and (2) a step of forming a circuit pattern to coat an outer surface of nano-fiber included in a predetermined region on the nano-fiber web using an electroless plating method.

In accordance with an embodiment of the present invention, the nano-fiber web may have a thickness of 5 to 200 µm.

In addition, the nano-fiber web may have a porosity of 10 to 80%.

In addition, the circuit pattern coated on the nano-fiber may have a thickness of 0.1 to 10 µm.

In addition, the nano-fiber web may have a thickness of 10 to 150 µm and a porosity of 30 to 60%, and the circuit pattern coated on the nano-fiber may have a thickness of 0.1 to 3 µm.

In addition, the step (2) may further include 2-1) a step of immersing the nano-fiber web in a catalyst solution to catalyze the same; 2-2) a step of activating the catalyzed nano-fiber web; and 2-3) a step of forming a circuit pattern on the activated nano-fiber web using an electroless plating method.

In addition, before the step (2), a step of degreasing or hydrophilizing the nano-fiber web may be further included.

In addition, the catalyst solution may include one or more compounds selected from the group consisting of salts of Ti, Sn, Au, Pt, Pd, Ni, Cu, Ag, Al, Zn and Fe.

In addition, the step 2-2) may be a step of immersing the catalyzed nano-fiber web in a sulfuric acid solution to activate the same.

In addition, the electroless plating method of the step (2) may be a step of masking a surface, except for a portion on which a circuit pattern is to be formed, of the nano-fiber web and immersing in a plating solution.

In addition, the plating solution may include a metal selected from the group consisting of Ti, Sn, Au, Pt, Pd, Ni, Cu, Ag, Al, Zn, and Fe.

In addition, the circuit pattern of the printed circuit nano-fiber web may include a first pattern in an upper region and a second pattern in a lower region, and the first pattern may be the same as the second pattern.

In addition, the circuit pattern may include a first circuit pattern formed on an upper surface of the nano-fiber web and a second circuit pattern formed on a lower surface thereof, wherein the first and second circuit patterns are formed in the same circuit pattern.

In addition, an opposite surface of a circuit pattern-printed surface of the printed circuit nano-fiber web may be further provided with a support for strength reinforcement.

In addition, the fiber-forming ingredient may include one or more compounds selected from the group consisting of polyurethane, polystyrene, polyvinyl alcohol, polymethyl methacrylate, polylactic acid, polyethylene oxide, polyvinyl acetate, polyacrylic acid, polycaprolactone, polyacrylonitrile, polyvinylpyrrolidone, polyvinyl chloride, polycarbonate, polyetherimide, polyethersulfone, polybenzimidazole, polyethylene terephthalate, polybutylene terephthalate, and a fluorine-based compound.

In accordance with another aspect of the present invention, there is provided a printed circuit nano-fiber web, including a nano-fiber web including a plurality of nano-fibers; and a circuit pattern formed by coating an outer surface of nano-fiber included in a predetermined region on the nano-fiber web.

In accordance with yet another aspect of the present invention, there is provided an electronic device, including the printed circuit nano-fiber web; and at least one electronic component mounted on the printed circuit nano-fiber web.

Advantageous Effects

In accordance with a method of manufacturing a printed circuit nano-fiber web according to the present invention, a circuit pattern-printed nano-fiber web having flexibility and resilience suitable for future smart devices can be realized. In addition, a circuit pattern can be densely formed to a uniform thickness on a flexible nano-fiber web using an electroless plating method, and the flexible nano-fiber web can include a plurality of pores. Accordingly, since the printed circuit nano-fiber web can satisfy waterproofness and air permeability characteristics, it can be used in various future industrial fields including medical devices, such as biopatches, and an electronic device, such as smart devices.

DESCRIPTION OF DRAWINGS

FIGS. 5 to 7 are scanning electron micrographs illustrating the thicknesses of circuit patterns plated under various plating conditions. FIG. 5 illustrates nano-fiber plated with a circuit pattern to a thinnest thickness.

BEST MODE FOR CARRYING OUT THE INVENTION

Figure 1:
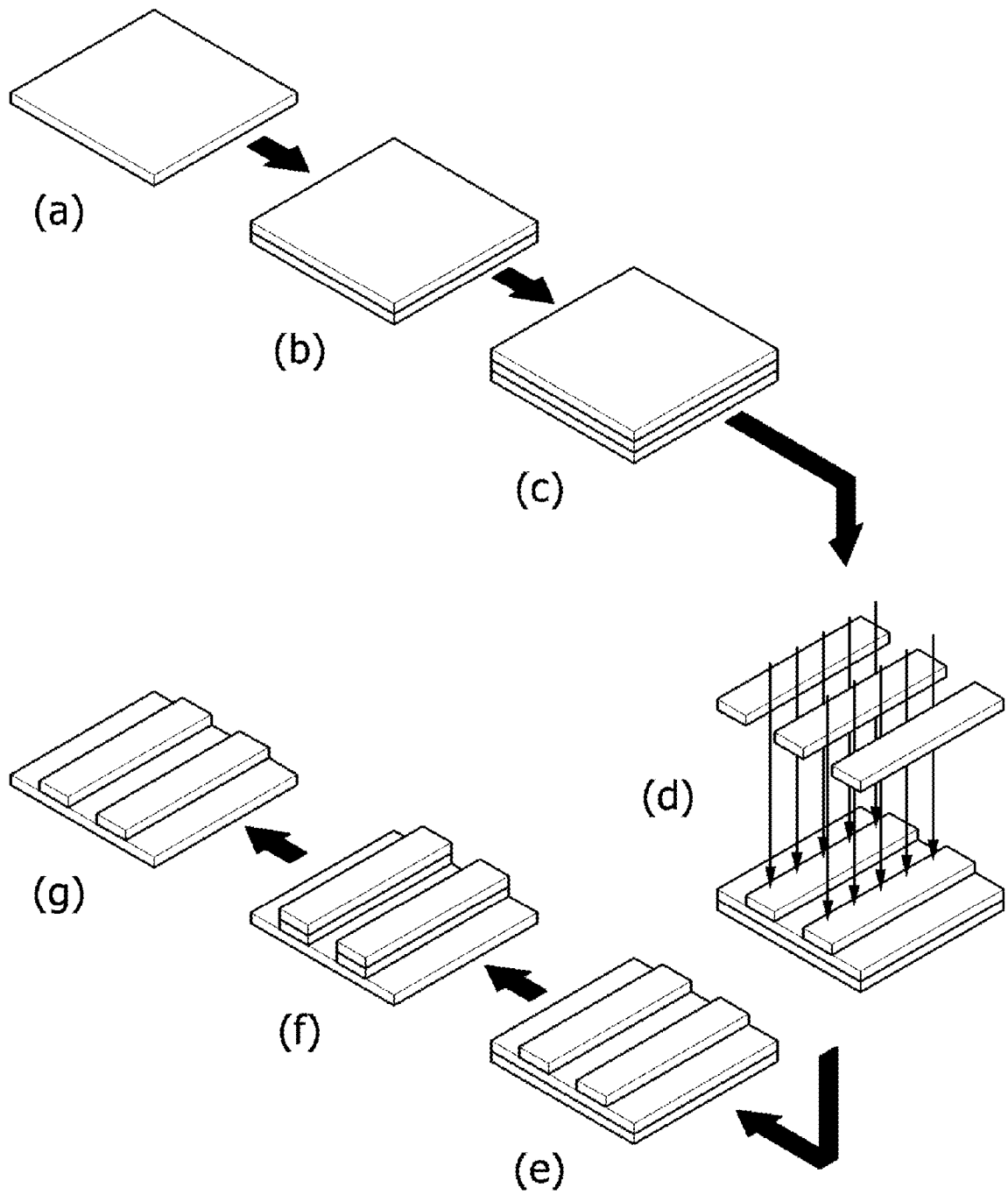
FIG. 1 illustrates a conventional deposition-lithography process.

Hereinafter, exemplary embodiments of the present invention are described in detail with reference to the accompanying drawings so that those of ordinary skill in the art can easily implement the present invention. However, the present invention may be implemented in various different forms and is not limited to these embodiments. To clearly describe the present invention, a part irrelevant to the description is omitted in the drawings, and like reference numerals in the specification denote like elements.

A method of manufacturing a printed circuit nano-fiber web according to the present invention includes (1) a step of electrospinning a spinning solution including a fiber-forming ingredient to manufacture a nano-fiber web; and (2) a step of forming a circuit pattern to coat an outer surface of nano-fiber included in a predetermined region on the nano-fiber web by an electroless plating method.

The step (1) is a step of electrospinning a spinning solution including a fiber-forming ingredient to manufacture a nano-fiber web provided with a circuit pattern. Prior to describing step (1) according to the manufacturing method of the present invention, a reason for using a nano-fiber web as a substrate for forming a circuit pattern will be described first.

General printed circuit boards can be classified into a rigid Printed Circuit Board (PCB) manufactured by adding a reinforcement material, such as glass fiber, to an epoxy resin and adhering copper foil thereto; a Flexible Printed Circuit Board (FPCB) manufactured by adhering copper foil onto a polyimide substrate; and a Rigid-Flexible Printed Circuit Board (R-F PCB) manufactured by combining advantages of the FPCB and the rigid PCB. In particular, a printed circuit board for future devices, such as a smart device, reflecting a recent trend is required to have excellent flexibility, resilience of maintaining an original flat state even when folded or crumpled, and excellent bending characteristics. However, in the case of polyimide used in existing FPCBs, it has a certain level of flexibility, but resilience of returning to an original flat state after being folded or crumpled is very poor and it is very vulnerable to warpage. Accordingly, polyimide is somewhat inadequate for future devices.

Therefore, the present invention provides a printed circuit nano-fiber web that is manufactured by printing a circuit pattern on a nano-fiber web formed by randomly accumulating a plurality of nano-fibers and, accordingly, exhibits excellent bending characteristics while having excellent flexibility and resilience to be suitable for application to the aforementioned future smart devices.

Figure 2:
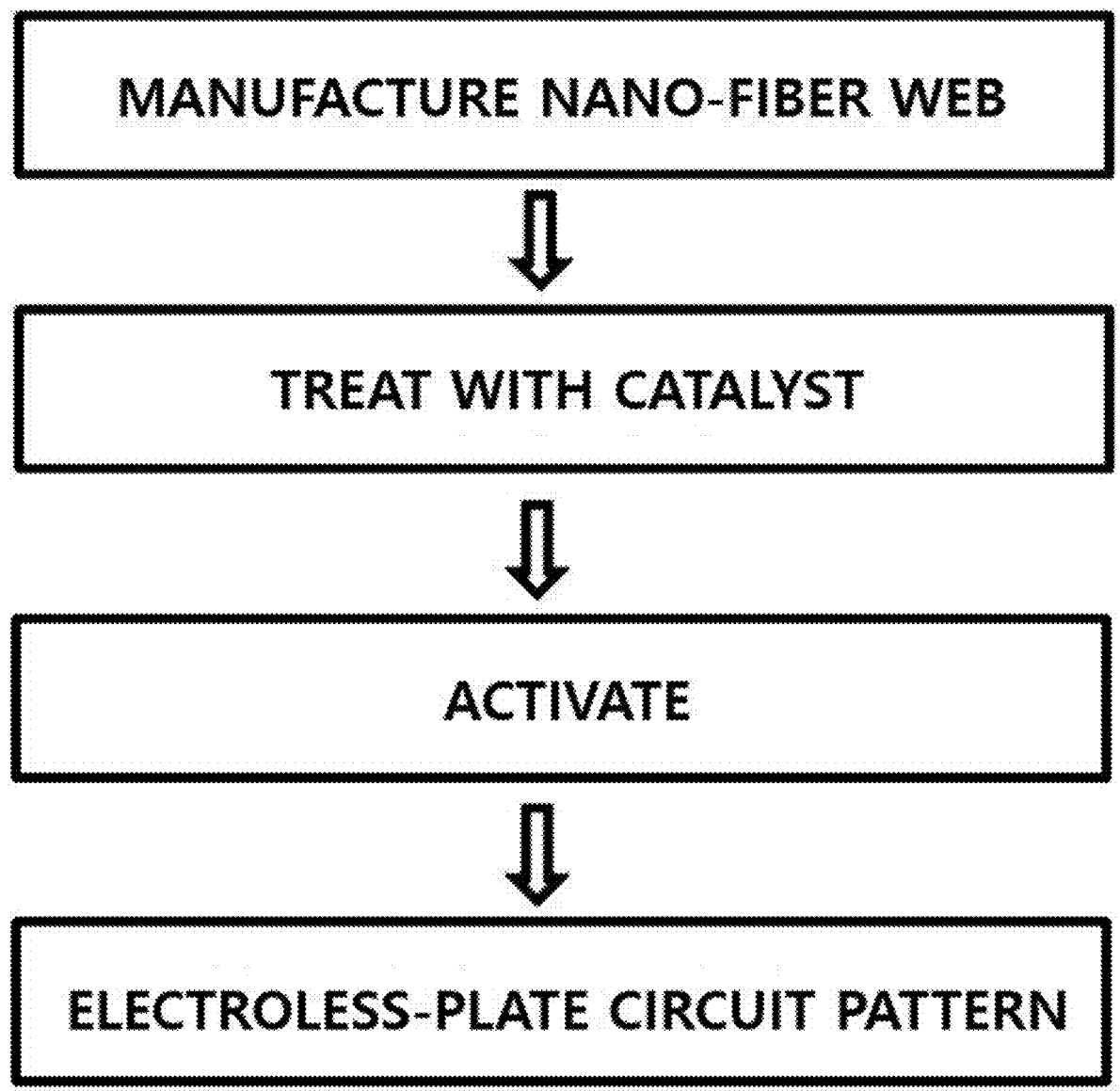
FIG. 2 is a flowchart illustrating an electroless plating method according to an embodiment of the present invention.

That is, in the case of a printed circuit nano-fiber web manufactured according to the method of the present invention, a circuit pattern is formed to surround an outer surface of nano-fiber constituting a nano-fiber web as shown in the flowchart of FIG. 2, so that excellent flexibility of the nano-fiber itself may be sufficiently utilized, and resilience of returning after being folded or crumpled may be improved due to the randomly stacked nano-fiber. Further, since implementation of a web-structured sheet is possible, it may be applied to future devices such as ultrathin devices and wearable devices.

The nano-fiber web may be manufactured by any methods of forming a fiber web having a three-dimensional network shape using nano-fiber, without specific limitation. Preferably, the nano-fiber web may be formed by electrospinning a spinning solution including a fiber-forming ingredient.

The fiber-forming ingredient included in the spinning solution for manufacturing the nano-fiber web is not specifically limited as long as it is a fiber-forming ingredient generally used in the art. Preferably, the fiber-forming ingredient may include one or more compounds selected from the group consisting of polyurethane, polystyrene, polyvinyl alcohol, polymethyl methacrylate, polylactic acid, polyethylene oxide, polyvinyl acetate, polyacrylic acid, polycaprolactone, polyacrylonitrile, polyvinylpyrrolidone, polyvinyl chloride, polycarbonate, polyetherimide, polyethersulfone, polybenzimidazole, polyethylene terephthalate, polybutylene terephthalate, and a fluorine-based compound.

In addition, the fluorine-based compound may include one or more compounds selected from the group consisting of polytetrafluoroethylene (PTFE)-based compounds, tetrafluoroethylene-perfluoroalkyl vinyl ether copolymers (PFA), tetrafluoroethylene-hexafluoropropylene copolymers (FEP), tetrafluoroethylene-hexafluoropropylene-perfluoroalkyl vinyl ether copolymers (EPE), tetrafluoroethylene-ethylene copolymers (ETFE), polychlorotrifluoroethylene (PCTFE)-based compounds, chlorotrifluoroethylene-ethylene copolymers (ECTFE), and polyvinylidene fluoride (PVDF)-based compounds, preferably polyvinylidene fluoride (PVDF).

Here, when the nano-fiber includes PVDF as a fiber-forming ingredient, a weight-average molecular weight of the PVDF may be, without being limited to, 10,000 to 1,000,000, preferably 300,000 to 600,000.

The fiber-forming ingredient may be included in an amount of 5 to 30% by weight, preferably 8 to 20% by weight, in the spinning solution. When the amount of the fiber-forming ingredient is less than 5% by weight, it may be difficult to form fiber. In addition, since spinning is accomplished in a droplet shape, not a fibrous shape, during spinning, a lot of beads are formed even if spinning is accomplished. Further, volatilization of a solvent is not accomplished well, so that pores may be clogged. On the other hand, when the amount of the fiber-forming ingredient is greater than 30% by weight, viscosity increases, so that solidification occurs on a surface of a solution. Accordingly, it may be difficult to spin for a long time, and it may be difficult to manufacture fiber having a size of micrometers or less due to an increased fiber diameter.

In addition, the spinning solution may further include a solvent. The solvent is not specifically limited as long as it does not cause generation of a precipitate of a fiber-forming ingredient and affect a spinning property of nano-fiber described below. The solvent may include preferably one or more selected from the group consisting of γ-butyrolactone, cyclohexanone, 3-hexanone, 3-heptanone, 3-octanone, N-methylpyrrolidone, dimethylacetamide, acetone dimethyl sulfoxide, and dimethylformamide. For example, the solvent may be a solvent mixture including dimethylacetamide and acetone.

The prepared spinning solution may be used to manufacture nano-fiber using a known electrospinning device and method. For example, as the electrospinning device, an electrospinning device provided with a single spinning pack having one spinning nozzle, or an electrospinning device provided with a plurality of single spinning packs or a spinning pack having a plurality of nozzles for mass production may be used. In addition, the electrospinning may be, without being limited to, dry spinning, or wet spinning requiring an external coagulation bath.

When a stirred spinning solution is fed to the electrospinning device and electrospun on a collector, for example, paper, a nano-fiber web formed of nano-fiber may be obtained. As an embodiment of a particular condition of the electrospinning, the air spray pressure of an air spray nozzle included in a spinning pack may be set to 0.01 to 0.2 MPa. When the air pressure is less than 0.01 MPa, collection and accumulation may not be satisfactorily performed. When the air pressure is greater than 0.2 MPa, a cone of a spinning nozzle may be hardened, which may cause clogging of a needle and thus a problem in spinning. In addition, upon spinning of the spinning solution, an injection rate of a spinning solution per nozzle may be 10 to 30 μl/min. In addition, a distance between a tip of the nozzle and a collector may be 10 to 30 cm. However, the present invention is not limited thereto, and may be changed according to purpose.

The thickness of the nano-fiber web manufactured in the step (1) may be 5 to 200 μm, preferably 10 to 150 μm. When the thickness of the nano-fiber web is less than 5 μm, a function of supporting a circuit pattern coated on an outer surface of nano-fiber provided in the nano-fiber web may be decreased, and durability and mechanical properties of a printed circuit nano-fiber web may be decreased. In addition, when the thickness of the nano-fiber web is greater than 200 μm, air generated in an electroless plating process may not escape from the nano-fiber web, durability and processability may be decreased, and there may be difficulties in performing thinning.

In addition, the nano-fiber web may have a porosity of 10 to 80%, preferably 30 to 60%. When the porosity of the nano-fiber web is less than 10%, elasticity may be decreased, the nano-fiber web may be peeled off during electroless plating, and durability may be decreased. When the porosity of the nano-fiber web is greater than 80%, durability, processability, and mechanical properties of a printed circuit nano-fiber web may be decreased, and electrical characteristics thereof may be deteriorated.

Meanwhile, to increase the stability of a circuit pattern formed on the nano-fiber web by reinforcing the insufficient strength of the nano-fiber web, the nano-fiber web may be further provided with a support for strength reinforcement on an opposite surface of a circuit pattern-printed surface of the printed circuit nano-fiber web. Here, a first nano-fiber web or a second nano-fiber web may be laminated on one or opposite surfaces of the support for strength reinforcement, but the present invention is not limited thereto.

Meanwhile, existing general methods of manufacturing a printed circuit board include a photolithography process including steps (a) to (g) as shown in FIG. 1. Here, since constant external pressure is applied in a process of forming a seed layer on a substrate surface with metal particles as in a sputtering process, it is difficult to form a circuit pattern on a substrate formed of a flexible material such as nano-fiber. Even if the circuit pattern is formed, a nano-fiber surface in contact with the circuit pattern is damaged or irregularities are formed thereon, so that adhesion to the circuit pattern is decreased. Accordingly, electrical conductivity may be decreased, so that reliability of an electronic component including the circuit pattern may be deteriorated.

In the step (2) of the method according to the present invention, a circuit pattern is formed to coat an outer surface of nano-fiber included in a predetermined region on the nano-fiber web by an electroless plating method.

The electroless plating method is a technology of allowing formation of a metal film through a spontaneous redox reaction of materials present in a solution, without applying electricity from the outside. When the electroless plating method is used to form a circuit pattern on the nano-fiber web according to the present invention, the following advantages are provided.

First, the uniformity of a plated circuit pattern may be constantly maintained, so that electrical conductivity and reliability of an electronic component including the plated circuit pattern may be improved. That is, since the electroless plating method deposits a metal using a reduction reaction unlike a general photolithography process or electroplating method of forming a metal film, a metal film may be uniformly formed on a substrate surface. Accordingly, the stability of an electronic component as well as uniformity of a product shape may be improved. However, the uniformity of a metal plating solution should be ensured so as to form a uniform circuit pattern. In addition, to prevent the generation of irregularities due to formation of an oxide film, the following activation step may be performed.

Second, the thickness of a circuit pattern may be easily adjusted by an electroless plating method, which increases utilization to various industrial groups. That is, since, in the case of the electroless plating method, a material present in a plating solution utilizes a redox reaction on a substrate surface, a deposition rate of a reduced metal may be controlled by adjusting reaction temperature and pH. Accordingly, the thickness of the circuit pattern may be adjusted more easily. According to an embodiment, when a nickel plating solution is plated by an electroless plating method, a deposition rate is highest in a range of pH 4 to 6. Accordingly, the thickness of a circuit pattern may be controlled by appropriately adjusting pH. However, since the lifespan of a plating solution that can reduce a metal generally increases as pH is low, pH may be designed to suit a targeted industrial group in consideration of a deposition rate, the lifespan of the plating solution, and a circuit pattern.

Third, since a circuit pattern may be simultaneously formed on a large amount of nano-fiber web by an electroless plating method, process simplification and cost reduction effects may be obtained. That is, when metal ions and a reducing agent are supplied in sufficient amounts, electroplating may be further performed 10 to 30 times although a plating solution is used in the same amount, so that a large amount of printed circuit nano-fiber web may be manufactured more quickly. Accordingly, processes including the electroplating may be significantly simplified, and an amount of discarded material may be reduced, which is eco-friendly and may reduce costs.

Fourth, since an electroless plating method uses a redox reaction by immersing in a plating solution as described above, a flexible substrate surface, such as a nano-fiber web, does not require application of an external force, and may be plated with a circuit pattern without specific treatment and surface damage.

Here, to manufacture the printed circuit nano-fiber web according to the present invention, a step of masking a surface, except for regions in which a circuit pattern is to be formed, on a nano-fiber web may be performed.

The masking step is provided to form a circuit pattern at only a specific region of the nano-fiber web. Any known masking processes for electroless plating may be used without specific limitation in a range in which the properties of the nano-fiber web are not affected. For example, a position at which a circuit pattern is to be formed may be adjusted by adhering a tape-type masking material to an entire surface, except for a region in which a circuit pattern is to be formed, of a nano-fiber web. In another embodiment, a method of spraying a masking material made of a liquid silicone may be used. In still another embodiment, a circuit pattern may be formed in a specific region using a case-shaped mask into which a nano-fiber web is inserted. Next, a nano-fiber web masked in such a manner may be immersed in a plating solution described below, thereby forming a circuit pattern only at a specific region thereof.

Meanwhile, the step (2) may include 2-1) a step of immersing the nano-fiber web in a catalyst solution to catalyze the same; 2-2) a step of activating the catalyzed nano-fiber web; and 2-3) a step of forming a circuit pattern on the activated nano-fiber web by an electroless plating method. Here, before the step (2), a step of degreasing or hydrophilizing the nano-fiber web may be further included.

The degreasing step is a step of washing an oxide or a foreign substance, particularly oil or fat, which is present on a nano-fiber web surface on which a circuit pattern is to be formed, with an acidic or alkali surfactant. Here, when a nano-fiber web surface on which a circuit pattern is to be formed is not washed by the degreasing step, a chemical reaction in a catalyst or activation step may be inhibited due to foreign substances or a void phenomenon, so that the circuit pattern may not be uniformly plated. Although the circuit pattern is plated, an adhesive force between the circuit pattern and the nano-fiber web may be greatly decreased, so that product reliability may be greatly decreased. When the acidic or alkali surfactant used in the degreasing step is not completely washed, it may act as a contaminant of a subsequent processing solution (catalyst solution or activation solution). Accordingly, the surfactant should be sufficiently washed under appropriate temperature and pressure ranges.

The hydrophilization step is a step of introducing a functional group, such as a carboxyl group, an amine group, or a hydroxyl group, onto the nano-fiber web surface while converting a hydrophobic nano-fiber web surface into a hydrophilic state to facilitate adsorption of metal ions, and forming fine cavities on the nano-fiber web surface to increase surface roughness of the nano-fiber web and, accordingly, increase an adhesive force between a deposited metal film and the nano-fiber web surface. The hydrophilizing step may be performed by mixing an alkali metal hydroxide or a nitrogen compound with a surfactant. Here, the hydroxide may be sodium hydroxide (NaOH), potassium hydroxide (KOH), or the like, and the nitrogen compound may include an ammonium salt, an amine compound, or the like. The ammonium salt may be, for example, ammonium hydroxide, ammonium chloride, ammonium sulfate, ammonium carbonate, an alkyl or aryl group-substituted ammonium salt, such as a triethylammonium salt, a tetraethylammonium salt, a trimethylammonium salt, a tetramethylammonium salt, a trifluoroammonium salt, or a tetrafluoroammonium salt, or the like. The amine compound may be, for example, an aliphatic amine compound, such as methylamine, ethylamine, dimethylamine, diethylamine, trimethylamine, ethylenediamine, or diethylenetriamine, urea, a hydrazine derivative, or the like. As the surfactant, an anionic surfactant, such as sodium alkyl sulfonate (SAS), sodium alkyl sulfate sodium (AS), sodium olefin sulfonate (AOS), or alkyl benzene sulfonate (LAS), a cationic surfactant, a neutral surfactant, or the like may be used. Here, the nano-fiber web is immersed in a hydrophilization solution including the compounds at 20 to 100° C. for 1 to 20 minutes to perform a hydrophilization step.

In addition, the step 2-1) is a step of depositing catalyst particles on the nano-fiber web surface that has been subjected to the degreasing and hydrophilization steps to catalyze the same for easy plating.

The catalyst solution includes one or more compounds selected from the group consisting of salts of Ti, Sn, Au, Pt, Pd, Ni, Cu, Ag, Al, Zn, and Fe. Preferably, a colloidal solution consisting of salts of Ti, Sn, Au, Pt, Pd, Ni, Cu, Ag, Al, Zn, and Fe, noble metal complex ions, or the like may be used. For example, as the colloidal solution, a solution including one or more salts selected from the group consisting of 50 to 250 ml of hydrochloric acid, 50 to 300 g of sodium chloride or potassium chloride, 5 to 60 g of tin chloride ($SnCl_2$), and 0.1 to 5 g of palladium chloride ($PdCl_2$) per liter of ultrapure water may be used.

Here, before performing the step 2-1), a pre-dipping process, as a preliminary catalyst treatment step, may be performed to improve adsorption efficiency of the catalyst particles. The pre-dipping process is a step of immersing a nano-fiber web in a low-temperature catalyst solution before a catalyst treatment step to prevent a catalyst solution used in the catalyst treatment step from being contaminated or to prevent a concentration change.

Next, the step 2-2) of activating the catalyzed nano-fiber web is performed.

The activation step is a step of, after the catalysis step, improving the activity of the adsorbed metal particles and a deposition behavior of an electroless plating solution. Through such an activation step, metal particles surrounding colloidal particles are removed and an adsorbed catalyst only remains, thereby further facilitating deposition of an electroless metal film. For example, the activation step may be a step of immersing in a mixed solution of distilled water and sulfuric acid for 30 seconds to 5 minutes, preferably 30 seconds to 3 minutes.

Next, the step 2-3) of forming a circuit pattern on the activated nano-fiber web by an electroless plating method is performed.

The electroless plating method may be generally classified into a reduction plating method and a substitution plating method. The reduction plating method is a method of depositing a metal using a reduction reaction to plate the metal on a substrate surface, and the substitution plating method is a method of allowing a metal having a relatively larger reducing power to be deposited and plated using a reducing power difference between metals. In the step 2-3), a substitution plating method may be used according to an embodiment of the present invention.

The substitution plating method is a method of immersing the nano-fiber web in a first plating solution having a relatively small reducing power, and then immersing the nano-fiber web in a second plating solution having a relatively strong reducing power to deposit and plate a metal of the second plating solution. The first and second plating solution may include a metal selected from the group consisting of Ti, Sn, Au, Pt, Pd, Ni, Cu, Ag, Al, Zn, and Fe. By such a substitution plating method, immersion is performed at 40 to 80° C. for 0.5 minutes to 10 minutes, preferably 45 to 75° C. for 1 minute to 8 minutes. Finally, a printed circuit nano-fiber web that is plated with copper ions may be obtained.

By the step (2), the circuit pattern is formed on the printed circuit nano-fiber web by coating an outer surface of nano-fiber included in the predetermined region on the nano-fiber web. That is, referring to FIGS. 3 and 4, a circuit pattern-formed nano-fiber in a predetermined region (region A) of a nano-fiber web may have a sheath/core shape, wherein the circuit pattern is formed on an outer surface of nano-fiber, unlike a nano-fiber web region (region B) in which a circuit pattern is not formed.

In addition, the thickness of the circuit pattern may be 0.1 to 10 μm, preferably 0.2 to 3 μm. When the thickness of the circuit pattern is less than 0.1 μm, thinning may be advantageously performed, but the stability of electrical characteristics due to the circuit pattern may be decreased due to an excessively thin thickness of the circuit pattern. In addition, an adhesive force between the circuit pattern and the nano-fiber web may be decreased, whereby the durability and reliability of a product may be deteriorated. Further, a porosity of the printed circuit nano-fiber web may increase, whereby durability and mechanical properties may be deteriorated. In addition, when the thickness of the circuit pattern is greater than 10 μm, a support function of the nano-fiber web may be decreased due to the weight of the circuit pattern, whereby mechanical properties may be deteriorated. In addition, there may be disadvantages in applying to weight-reduced thin screens used in small electronic products. Further, elasticity may be decreased as a porosity of the printed circuit nano-fiber web is decreased, and durability and processability may be deteriorated.

Meanwhile, a nano-fiber web according to an embodiment of the present invention may include a first pattern in an upper region and a second pattern in a lower region which are formed by a circuit pattern. The first pattern and the second pattern may be the same. In this case, since the same circuit patterns may be formed through one immersion process by adjusting the thickness of the nano-fiber web, there are advantages in terms of process simplification and economic efficiency. On the contrary, the first and second patterns may be different. Since the first and second patterns may be appropriately selected considering the purpose and use of the printed circuit nano-fiber web according to the present invention, the shape and size of the circuit pattern are not specifically limited.

Meanwhile, the printed circuit nano-fiber web may be manufactured by forming a circuit pattern layer on at least one surface of the nano-fiber web using a printed electronics method, instead of an electroless plating method, in the step (2). In this case, since only a desired circuit pattern portion is printed on a substrate, a film, or the like using a conductive electronic ink, the circuit pattern portion may be printed through two processes, which greatly contributes to process simplification. In addition, the accuracy of circuit pattern formation increases, and there is almost no wasted material, which greatly reduces the manufacturing costs.

Here, the printed electronics method may be a method generally used in the art. Preferably, any one of inkjet printing and flexography may be used. However, the printed electronics method of the present invention is not limited to these methods, and any printed electronics methods may be used.

Here, the inkjet printing method is a method of forming a circuit pattern by ejecting minute conductive ink droplets (hereinafter referred to as droplets) from a head and colliding with a target substrate. Such an inkjet printing method may be classified into a continuous method of continuously ejecting droplets and a drop-on-demand method of selectively ejecting droplets, according to a droplet ejection manner. Here, the continuous method generally requires a large apparatus and is used for low-resolution patterning, whereas the drop-on-demand method is used when high-resolution patterning is required.

In addition, the drop on demand method may be classified into a piezo method of applying pressure to an ink using a piezoelectric element to eject droplets; and a bubblejet method of instantly generating bubbles by applying heat to an ink and then ejecting droplets by pressure of the bubbles. The piezo method is advantageous in that the lifespan of a head is relatively long because no heat is applied to an ink and it is not required to consider thermal denaturation upon selection of an ink, but is disadvantageous in that head production costs increase for high-resolution patterning.

The flexography method is a method of applying a conductive ink on an anilox roller having a uniform grating and uniformly spreading the conductive ink using a doctor blade, followed by contacting the anilox roller with a printing roll and transferring a conductive ink in an embossed pattern on a flexible resin plate of the printing roll, thereby printing the pattern on a target substrate surface.

Here, the printed electronics method may include a step of spraying a conductive ink on a nano-fiber web; and a step of sintering the sprayed conductive ink to form a circuit pattern layer on at least one surface of the nano-fiber web.

In the step of spraying a conductive ink, the conductive ink may include conductive particles of at least one of gold, silver, copper, platinum, palladium, nickel, aluminum, and carbon. In consideration of conductivity and chemical resistance, gold, silver, and platinum are preferred. In consideration of costs and a sintering temperature that will be described below, silver is more preferred. However, conductive particles included in the conductive ink are not limited to the aforementioned metal particles, and include any metals or non-metals used as a material of a conductive ink. For example, conductive particles of the conductive ink may be derived from gold formate, silver formate, copper formate, platinum formate, palladium formate, nickel formate, aluminum formate, gold acetate, silver acetate, copper acetate, platinum acetate, palladium acetate, nickel acetate, aluminum acetate, gold oxalate, silver oxalate, copper oxalate platinum oxalate, palladium oxalate, nickel oxalate, aluminum oxalate, gold malonate, silver malonate, copper malonate, platinum malonate, palladium malonate, nickel malonate, aluminum malonate, gold phthalate, silver phthalate, copper phthalate, platinum phthalate, palladium phthalate, nickel phthalate, aluminum phthalate, and the like. Here, the conductive particles may be nanoscale or microscale particles, and the type of the conductive particles and the content of a conductive ink may be appropriately selected according to the properties of the circuit pattern layer without specific limitation.

In addition, the conductive ink may further include a solvent and a binder for uniform dispersion of the conductive particles. Additives for printed electronics may be contained, in a range in which the effect of the present invention is not affected, according to an intended use and need. For example, a viscosity aid, a conductive aid, a chalking inhibitor, an antioxidant, a pH aid, a drying inhibitor, an adhesion agent, a preservative, an antifoaming agent, a leveling agent, a surfactant and the like may be included. When a binder is added, adhesion to a nano-fiber web increases, thereby inducing uniform dispersion of a conductive ink. As such, the compositions and ratios of additional additives may be appropriately selected in consideration of the properties of a circuit pattern layer such that the additional additives are completely evaporated though a sintering process described below and, accordingly, the circuit pattern layer is uniformly formed.

Meanwhile, conductive particles included in the conductive ink may be prepared by dispersing the same in a solvent as described above. By the way, since conductive particles are very unstably dispersed in an initial dispersion step, they may aggregate again. In particular, when nano-scale conductive particles are used as in the present invention, uniformity and electrical characteristics, such as electrical conductivity, of a circuit pattern layer may be deteriorated upon circuit pattern formation through a printing process due to aggregation of the particles.

Accordingly, sintering is performed in a step of forming a circuit pattern layer described below, so that a uniform circuit pattern layer may be formed without use of a dispersant, etc. for controlling dispersion.

Next, a step of forming a circuit pattern layer on at least one surface of the nano-fiber web by sintering the sprayed conductive ink is performed.

The circuit pattern layer formation step is a step of forming a circuit pattern layer by solidifying the conductive ink. As additional effects of the circuit pattern layer formation step, dispersion stability and uniformity of the conductive ink are improved as described above, so that a uniform circuit pattern layer is formed.

Sintering refers to a phenomenon wherein, when a powder receives strong energy from the outside, particles of the powder bind to each other and thus the powder is solidified. In the case of a conductive ink consisting of the metal particles, particles simply bind to each other when subjected to a sintering process, so that a particle size increases. Ideally, the size-increased particles are changed into a thin film shape in which voids are not present. In addition, since materials, such as additives, additionally added to surfaces of metal particles to increase dispersion stability are pyrolyzed or volatilized, conductive characteristics may be maximized.

A sintering treatment method according to an embodiment of the present invention may be a method of thermally treating an ink printed on a substrate using an oven or a furnace. However, the present invention is not limited thereto, and various known sintering treatment methods may be performed in a range in which the properties of a nano-fiber web on which a circuit pattern layer is to be formed are not affected.

Meanwhile, since the method of manufacturing a printed circuit nano-fiber web of the present invention adopts an electroless plating method, a circuit pattern may be densely formed to a uniform thickness on a flexible nano-fiber web, and the flexible nano-fiber web may include a plurality of pores. Accordingly, since the printed circuit nano-fiber web may satisfy waterproofness and air permeability characteristics, it may be used in various future industrial fields including medical devices, such as biopatches, and an electronic device, such as smart devices.

Figure 3:
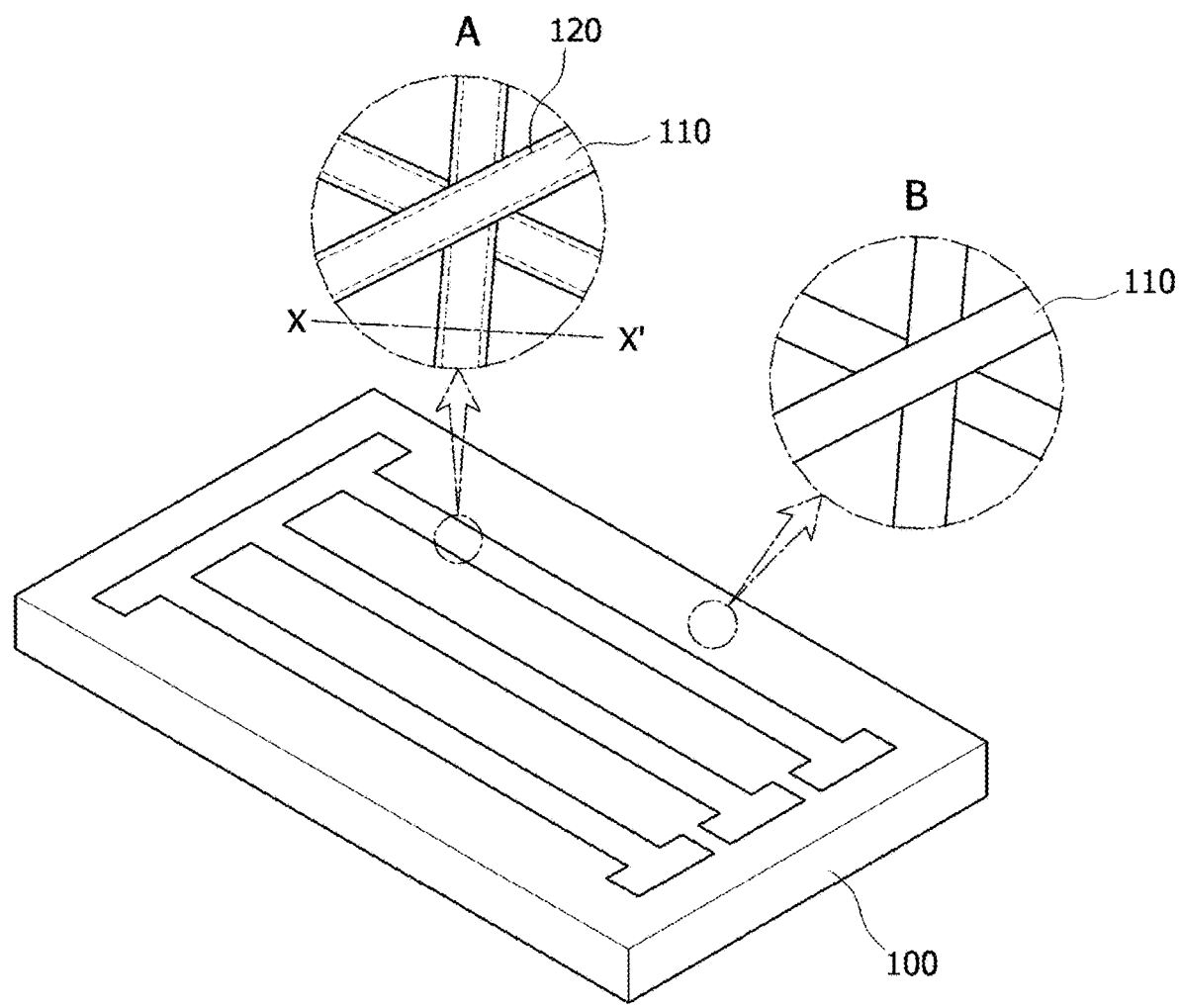
FIG. 3 is a schematic view illustrating a circuit pattern formed on a predetermined region of a nano-fiber web according to an embodiment of the present invention.
Figure 4:
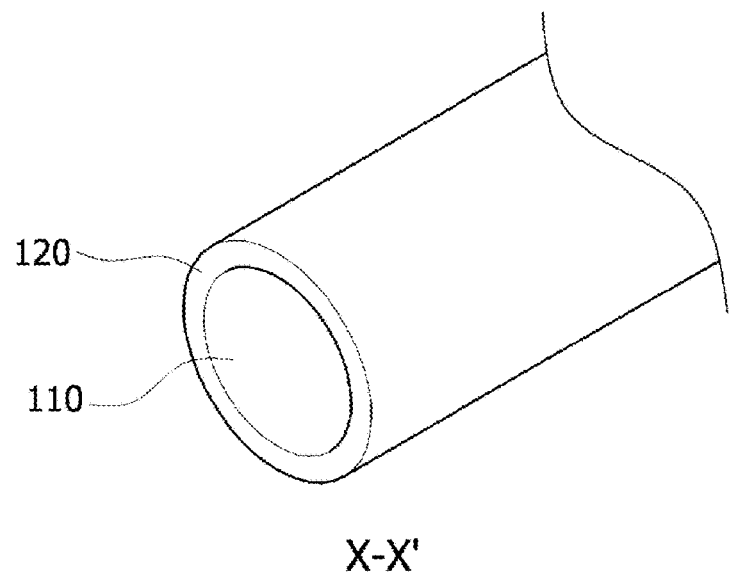
FIG. 4 is a perspective view illustrating a nano-fiber sectional view taken along boundary line X-X' of FIG. 3.
Figure 5:
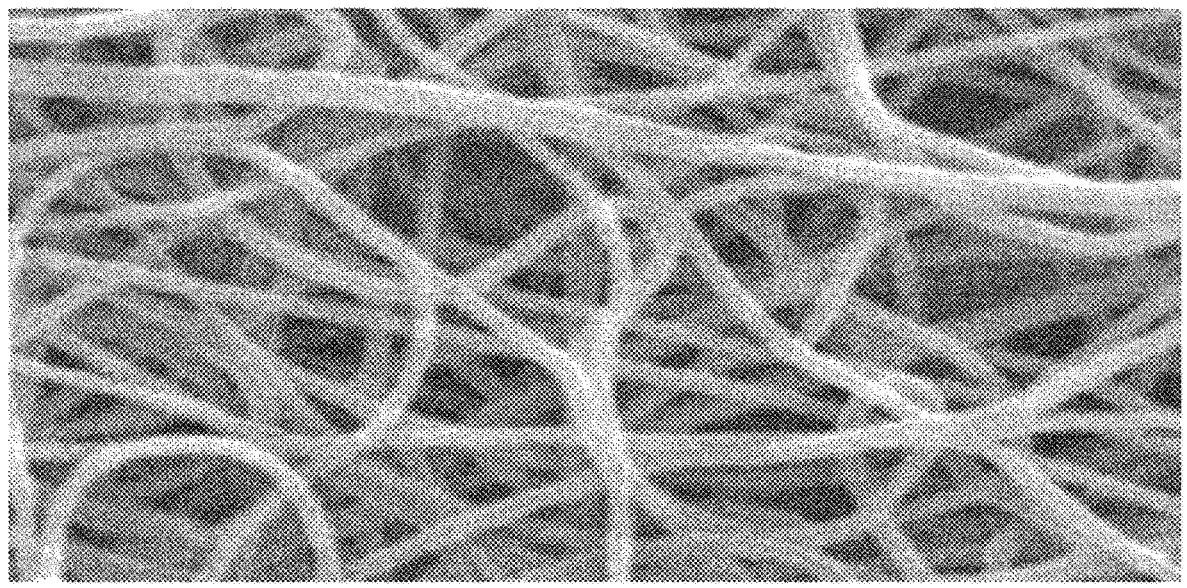
Figure 6A:
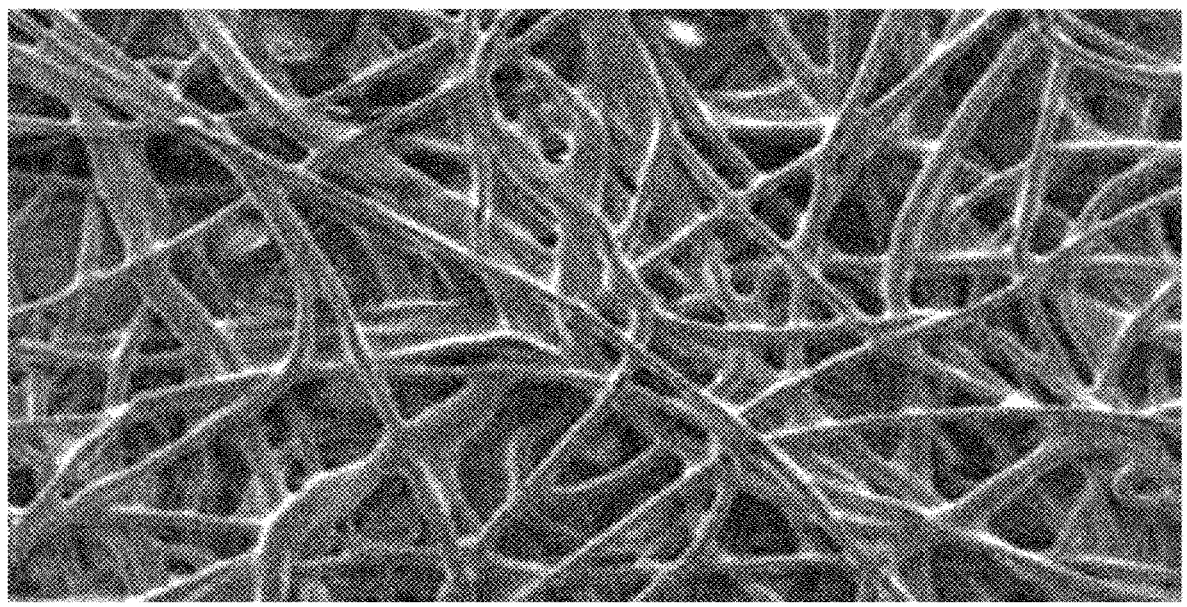
FIGS. 6a and 6b illustrate nano-fiber plated with a circuit pattern to a thicker thickness than the nano-fiber of FIG. 5, and FIGS. 7a and 7b illustrate nano-fiber plated with a circuit pattern to a thickest thickness.
Figure 6B:
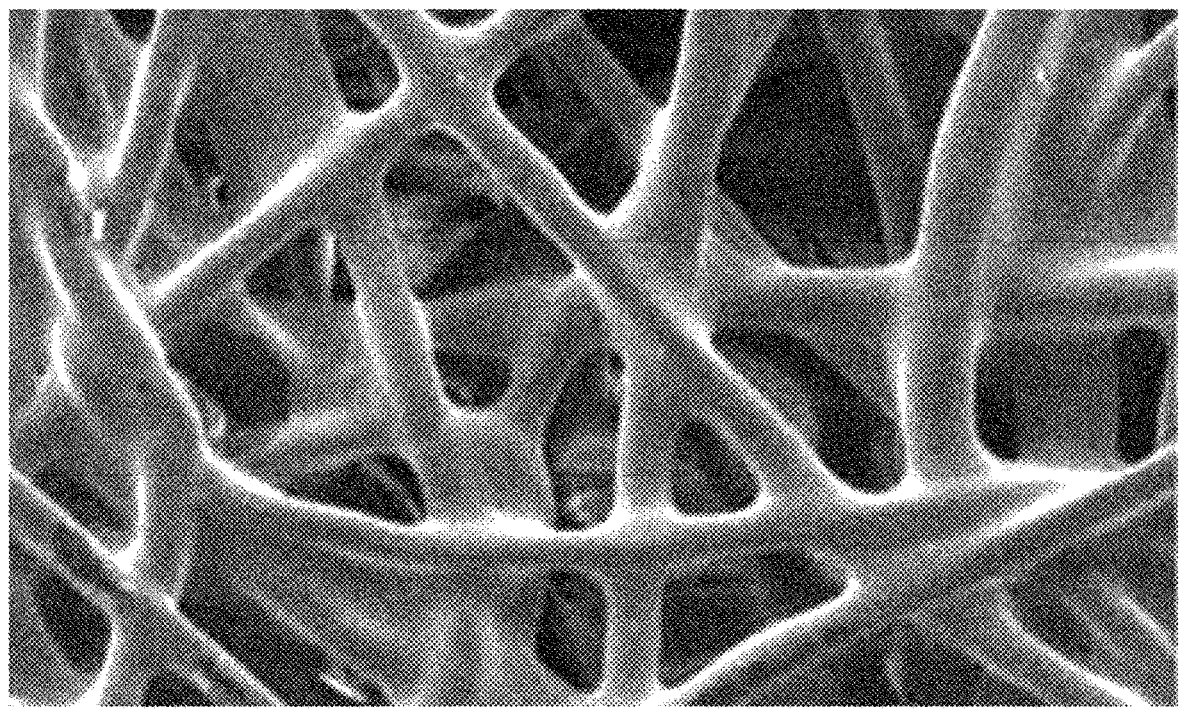
Figure 7A:
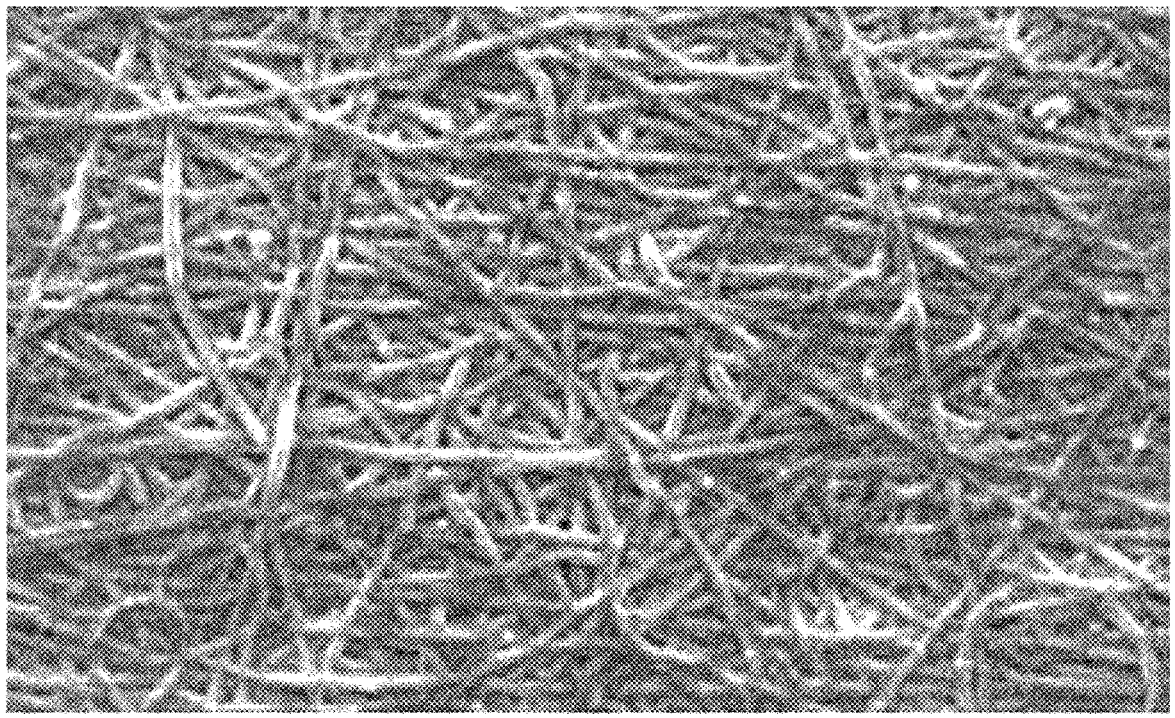
Figure 7B:
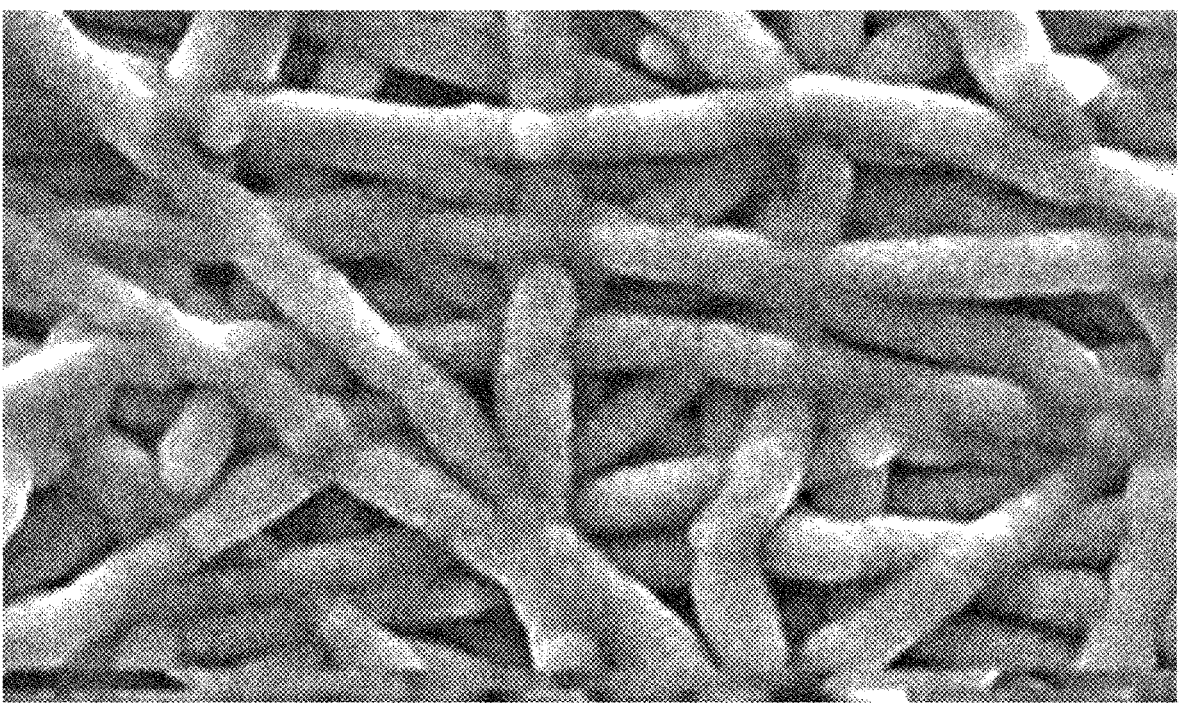

In addition, the present invention provides a printed circuit nano-fiber web that includes a nano-fiber web 100 including a plurality of nano-fibers 110; and a circuit pattern 120 formed by coating outer surfaces of the nano-fibers 110 included in a predetermined region on the nano-fiber web 100, as shown in FIG. 3. Here, the predetermined region refers to a region (A), in which the circuit pattern 120 is to be formed, on the nano-fiber web 100. Since other descriptions of the printed circuit nano-fiber web are the same as the descriptions of the step (2), they will be omitted.

Figure 8:
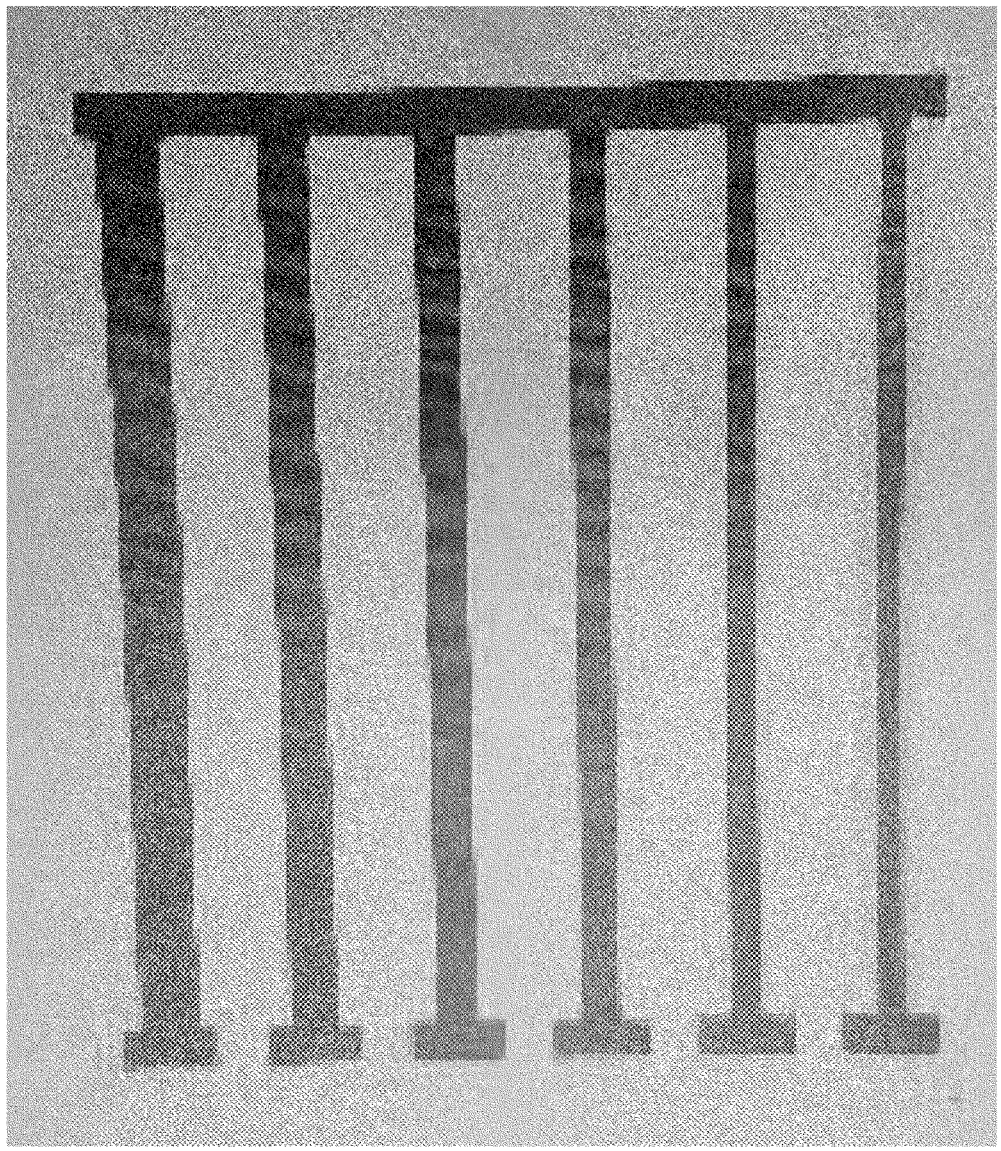
FIGS. 8 to 9 illustrate printed circuit nano-fiber webs manufactured by a manufacturing method according to an embodiment of the present invention.
Figure 9:
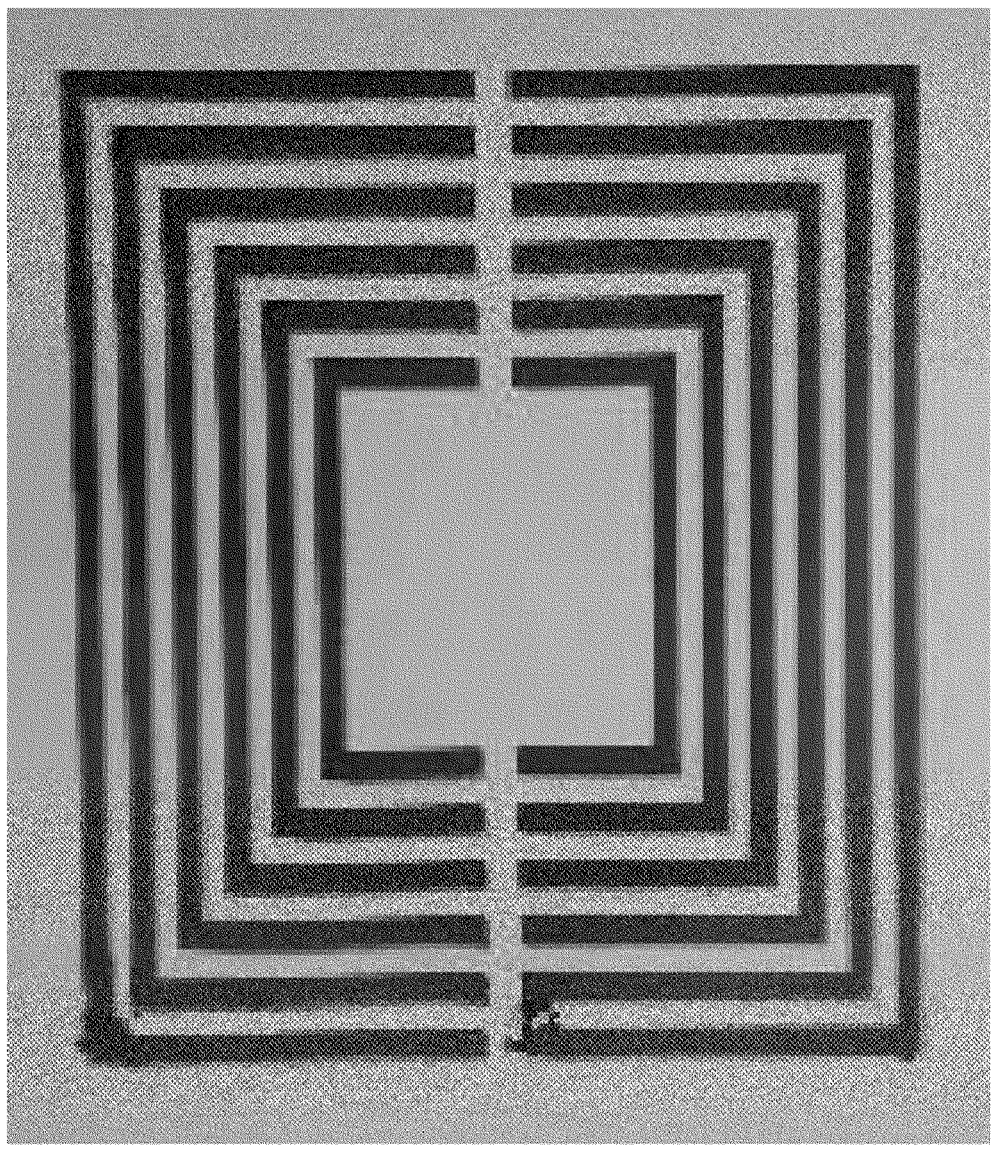

In addition, referring to FIGS. 8 and 9, various circuit patterns may be formed on a nano-fiber web made of a flexible material. That is, the printed circuit nano-fiber web according to the present invention not only has remarkably improved flexibility and resilience, compared to existing FPCBs, but also excellent flexibility and elasticity. Accordingly, the printed circuit nano-fiber web according to the present invention may be utilized as a biopatch in the medical industry or may be manufactured in the form of various sensors attachable to any part of the body. Such a printed circuit nano-fiber web may be utilized in various industrial fields related to electronic devices including the Internet of Things in the future, thereby promoting the development of related industries.

In addition, the present invention provides an electronic device that includes the printed circuit nano-fiber web and at least one electronic component mounted on the printed circuit nano-fiber web.

The electronic component may be appropriately selected according to various target industries. For example, the electronic component may be a sensor unit including at least one of a biosensor for detecting a user's physical condition and an environmental sensor for sensing an environment, a near field communication module used for near field communication, or an electronic device including an antenna pattern used for wireless communication and a control unit for performing a signal processing function.

MODE FOR CARRYING OUT THE INVENTION

Hereinafter, the present invention will be described in more detail with reference to the following Examples. It will be apparent to those skilled in the art that the Examples are merely for concretely explaining the invention and therefore, there is no intent to limit the invention to the Examples.

Example 1

First, to prepare a spinning solution, a fiber-forming ingredient was prepared by mixing 30 parts by weight of polyurethane based on 100 parts by weight of polyvinylidene fluoride, and 15 g of the fiber-forming ingredient was dissolved in 85 g of dimethyl acetamide and acetone mixed in a weight ratio of 70:30 at 80° C. for 6 hours using a magnetic bar. The spinning solution was fed into a solution tank of an electrospinning device, and ejected at a rate of 15 μl/min/hole. Here, the temperature at a spinning section was maintained at 30° C. and a humidity of 50%, and a distance between a collector and a spinning nozzle tip was 20 cm. Using a high-voltage generator, each spin pack nozzle was provided with an air pressure of 0.03 MPa while providing a spin nozzle pack with a voltage of 40 kV or more, thereby manufacturing a fiber web formed of PVDF/PU composite nano-fiber. Next, a calendering process was performed at 140° C. or higher under a pressure of 1 kgf/cm$^2$ to dry a solvent and moisture remaining in the fiber web. The resultant nano-fiber web had a thickness of 20 μm and a porosity of 55%.

Next, a mask for forming a pattern was manufactured by punching a PET film, which included a silicone adhesive ingredient, along a pattern mold. The manufactured PET mask was attached to opposite surfaces of the manufactured nano-fiber web such that only the pattern was exposed. As a result, a masked nano-fiber web was manufactured.

Next, a metal shell formed of nickel/copper was formed on the masked nano-fiber web. In particular, the nano-fiber web was subjected to nickel/copper electroless plating. For this, the nano-fiber web was immersed in a 60° C. degreasing solution (ATS condiclean 10%, pure water) for 30 seconds, and then washed with pure water. Again, the nano-fiber web was immersed in a 60° C. etching solution (5M NaOH, pure water) for 1 minute, and then washed with pure water. Next, the washed nano-fiber web was immersed in a room-temperature catalyst solution (Pd 0.9%, HCl 20%, pure water) for 3 minutes, and then washed with pure water. Next, the nano-fiber web was immersed for 30 seconds in a 50° C. sulfuric acid solution ($H_2SO_4$ 85 ml/L, pure water) for catalytic activity, and then washed with pure water. Next, the nano-fiber web was immersed in a 60° C. nickel ion solution for 30 seconds, and then washed with pure water, so that an outer surface of the nano-fiber of the nano-fiber web was coated with a metal shell formed of nickel to a thickness of 0.05 μm. Next, the metal shell-coated nano-fiber web was immersed in a 40° C. copper ion solution for 2 minutes, and then washed with pure water, so that the outer surface of the nano-fiber on which the metal shell formed of nickel had been coated was coated with a metal shell formed of copper to a thickness of 0.15 μm. After formation of the metal shell, the mask was removed, so that a printed circuit nano-fiber web having a line width of 0.3 cm and a length of 10 cm was manufactured.

Examples 2 to 12

Printed circuit nano-fiber webs were manufactured in the same manner as in Example 1, except that the thickness and porosity of a nano-fiber web, the thickness of a circuit pattern, a circuit pattern formation method, and the like were changed as in Tables 1 to 3 below. Results are summarized in Tables 1 to 3.

Comparative Example 1

A printed circuit nano-fiber web was manufactured in the same manner as in Example 1, except that nickel/copper was deposited by resistance heating vacuum deposition, instead of electroless plating, sputtering was performed to an average thickness of 0.2 μm, and a photolithography process was performed. A photoresist was surface-coated using a spin coater, and then UV was irradiated using a patterned mask. Next, a pattern was formed by immersing in a developing solution for 30 seconds, and then a circuit pattern was formed through an etching process. As a result, a printed circuit nano-fiber web having a line width of 0.3 cm and a length of 10 cm was manufactured.

Comparative Example 2

A printed circuit substrate was manufactured in the same manner as in Example 1, except that a polyimide substrate was used instead of a nano-fiber web.

Experimental Example

Printed circuit nano-fiber webs manufactured according to the examples and the comparative examples were subjected to property evaluation. Results are summarized in Tables 1 to 3.

1. Flexibility and Resilience Evaluation

Each of the printed circuit nano-fiber webs manufactured according to the examples and the comparative examples was bent 180° using a stainless steel rod with a diameter of 30 mm and then restored. A change rate compared to an initial resistance was measured to evaluate flexibility and resilience.

2. Elasticity Evaluation

A circuit pattern of each of the printed circuit nano-fiber webs manufactured according to the examples and the comparative examples was stretched 1.2 times in a longitudinal direction using a jig, and then a change rate compared to an initial resistance was measured to evaluate elasticity.

3. Durability Evaluation

For each of the printed circuit nano-fiber webs manufactured according to the examples and the comparative examples, during the flexibility, resilience, and elasticity evaluation, durability was evaluated as ○ when no problem occurred, and evaluated as x when any problems, such as peeling of a circuit pattern and crack generation, occurred.

4. Processability Evaluation

To evaluate processability, it was evaluated as ○ when no problem occurred during a manufacturing process of each of the printed circuit nano-fiber webs manufactured according to the examples and the comparative examples, and it was evaluated as x when any problems, such as damage and non-uniformity of a circuit and peeling of a fiber web, occurred during the manufacturing process.

5. Resistance Measurement

Each of the printed circuit nano-fiber webs manufactured according to the examples and the comparative examples was subjected to printed circuit surface resistance measurement using a resistance meter (HIOKI 3540 mΩ HITESTER, HIOKI).

TABLE 1

| Classification | | Example 1 | Example 2 | Example 3 | Example 4 | Example 5 |
|---|---|---|---|---|---|---|
| Nano-fiber web | Thickness (μm) | 20 | 1 | 10 | 150 | 250 |
| | Porosity (%) | 55 | 55 | 55 | 55 | 55 |
| Circuit pattern | Thickness (μm) | 0.2 | 0.2 | 0.2 | 0.2 | 0.2 |
| | Formation method | Electroless plating | Electroless plating | Electroless plating | Electroless plating | Electroless plating |
| Flexibility and resilience evaluation (%) | | 3.6 | 5.3 | 2.9 | 18.9 | 21.6 |
| Elasticity evaluation (%) | | 17.4 | 106.2 | 42.3 | 155.3 | 186.2 |
| Durability evaluation | | ○ | x | ○ | ○ | x |
| Processability evaluation | | ○ | ○ | ○ | ○ | x |
| Resistance (Ω) | | 1.21 | 58.24 | 0.92 | 0.47 | 1.60 |

TABLE 2

| Classification | | Example 6 | Example 7 | Example 8 | Example 9 | Example 10 |
|---|---|---|---|---|---|---|
| Nano-fiber web | Thickness (μm) | 20 | 20 | 20 | 20 | 20 |
| | Porosity (%) | 5 | 30 | 60 | 90 | 55 |
| Circuit pattern | Thickness (μm) | 0.2 | 0.2 | 0.2 | 0.2 | 0.05 |
| | Formation method | Electroless plating | Electroless plating | Electroless plating | Electroless plating | Electroless plating |
| Flexibility and resilience evaluation (%) | | 21.4 | 8.8 | 3.3 | 3.2 | 2.1 |
| Elasticity evaluation (%) | | 126.2 | 55.1 | 19.2 | 73.8 | 71.5 |
| Durability evaluation | | x | ○ | ○ | x | x |
| Processability evaluation | | x | ○ | ○ | x | ○ |
| Resistance (Ω) | | 1.43 | 0.84 | 2.54 | 147.1 | 151.7 |

TABLE 3

| Classification | | Example 11 | Example 12 | Comparative Example 1 | Comparative Example 2 |
|---|---|---|---|---|---|
| Nano-fiber web | Thickness (μm) | 20 | 20 | 20 | 20 |
| | Porosity (%) | 55 | 55 | 55 | PI substrate |
| Circuit pattern | Thickness (μm) | 3 | 12 | 0.2 | 0.2 |
| | Formation method | Electroless plating | Electroless plating | Photolithography | Electroless plating |
| Flexibility and resilience evaluation (%) | | 16.6 | 31.7 | 5.1 | 3.2 |
| Elasticity evaluation (%) | | 203.5 | 532.1 | 18.6 | 197.1 |
| Durability evaluation | | ○ | x | x | x |
| Processability evaluation | | ○ | ○ | x | ○ |
| Resistance (Ω) | | 0.52 | 0.31 | 237.3 | 18.5 |

As shown in Tables 1 to 3, Examples 1, 3, 4, 7, 8 and 11 satisfying all of the nano-fiber web thickness, porosity, circuit pattern thickness, and circuit pattern formation method of the present invention exhibit excellent flexibility, resilience, elasticity, durability and processability, satisfy a minimum resistance allowing use as a circuit, and exhibit a significantly low resistance, compared to Examples 2, 5, 6, 9, 10, and 12 and Comparative Examples 1 and 2 not satisfying at least one of the nano-fiber web thickness, porosity, circuit pattern thickness, and circuit pattern formation method.

Although examples of the present invention have been described above, the spirit of the present invention is not limited to the examples presented herein, and those skilled in the art who understand the spirit of the present invention may easily propose other embodiments by the additions, modifications, deletions, etc. of components within the scope of the same spirit. However, such additions, modifications, deletions, etc. will also fall within the scope of the present invention.

The invention claimed is:

1. A method of manufacturing a printed circuit nano-fiber web, the method comprising:

(1) a step of electrospinning a spinning solution comprising a fiber-forming ingredient to manufacture a nano-fiber web; and (2) a step of forming a circuit pattern to coat an outer surface of nano-fiber included in a predetermined region on the nano-fiber web using an electroless plating method, wherein the nano-fiber web has a porosity of 30 to 60% and a thickness of 10 to 150 µm, wherein the circuit pattern coated on the nano-fiber has a thickness of 0.2 to 3 µm, wherein the fiber-forming ingredient comprises polyurethane and polyvinylidene fluoride, wherein the fiber-forming ingredient is 5 to 30% by weight of the spinning solution, wherein the step (2) further comprises:

2-1) a step of immersing the nano-fiber web in a catalyst solution to catalyze the same;

2-2) a step of activating the catalyzed nano-fiber web; and 2-3) a step of forming a circuit pattern on the activated nano-fiber web using an electroless plating method.

2. The method according to claim 1, wherein, before the step (2), a step of degreasing or hydrophilizing the nano-fiber web is performed.

3. The method according to claim 1, wherein the catalyst solution comprises one or more compounds selected from the group consisting of salts of Ti, Sn, Au, Pt, Pd, Ni, Cu, Ag, Al, Zn and Fe.

4. The method according to claim 1, wherein the step 2-2) is a step of immersing the catalyzed nano-fiber web in a sulfuric acid solution to activate the same.

5. The method according to claim 1, wherein the electroless plating method of the step (2) is a step of masking a surface, except for a portion in which a circuit pattern is to be formed, of the nano-fiber web and immersing in a plating solution.

6. The method according to claim 5, wherein the plating solution comprises a metal selected from the group consisting of Ti, Sn, Au, Pt, Pd, Ni, Cu, Ag, Al, Zn, and Fe.

7. The method according to claim 1, wherein the printed circuit nano-fiber web comprises a first circuit pattern in a first region of the printed circuit nano-fiber web and a second circuit pattern in a second region of the printed circuit nano-fiber web, and the first pattern is the same as the second pattern.

8. The method according to claim 1, wherein an opposite surface of a circuit pattern-printed surface of the printed circuit nano-fiber web is further provided with a support for strength reinforcement.

\* \* \* \* \*